United States Patent
Boyd et al.

(10) Patent No.: US 7,719,806 B1
(45) Date of Patent: May 18, 2010

(54) SYSTEMS AND METHODS FOR ESD PROTECTION

(75) Inventors: Graeme B. Boyd, North Vancouver (CA); Xun Cheng, Chengdu (CN); Bijit Patel, Allen, TX (US)

(73) Assignee: PMC-Sierra, Inc., Santa Clara, CA (US)

( * ) Notice: Subject to any disclaimer, the term of this patent is extended or adjusted under 35 U.S.C. 154(b) by 612 days.

(21) Appl. No.: 11/672,304

(22) Filed: Feb. 7, 2007

Related U.S. Application Data

(60) Provisional application No. 60/765,833, filed on Feb. 7, 2006.

(51) Int. Cl.
*H02H 9/00* (2006.01)
*H02H 1/00* (2006.01)

(52) U.S. Cl. ...................................... 361/56
(58) Field of Classification Search .............. 361/56
See application file for complete search history.

(56) References Cited

U.S. PATENT DOCUMENTS

| | | | |
|---|---|---|---|
| 4,296,335 A * | 10/1981 | Simcoe ................ | 327/108 |
| 5,319,259 A | 6/1994 | Merrill | |
| 5,615,073 A * | 3/1997 | Fried et al. ............ | 361/56 |
| 5,617,283 A * | 4/1997 | Krakauer et al. ....... | 361/56 |
| 5,708,550 A | 1/1998 | Avery | |
| 6,275,089 B1 * | 8/2001 | Song et al. ............ | 327/314 |
| 6,369,994 B1 * | 4/2002 | Voldman .............. | 361/56 |
| 6,388,850 B1 * | 5/2002 | Ker et al. ............. | 361/56 |
| 6,424,510 B1 | 6/2002 | Ajit et al. | |
| 6,847,059 B2 | 1/2005 | Tsuji et al. | |
| 6,963,111 B2 * | 11/2005 | Reddy et al. .......... | 257/356 |
| 7,304,827 B2 * | 12/2007 | Chen et al. ............ | 361/56 |
| 2003/0128486 A1 * | 7/2003 | Chuang et al. ......... | 361/56 |
| 2006/0044718 A1 * | 3/2006 | Su et al. .............. | 361/56 |

* cited by examiner

*Primary Examiner*—Ronald W Leja
(74) *Attorney, Agent, or Firm*—Knobbe Martens Olson & Bear LLP

(57) ABSTRACT

A negative electrostatic discharge (ESD) protection network or circuit is described. The circuit can provide protection against a negative-going ESD transient. One embodiment, along with standard positive ESD protection networks, can discharge ESD currents in both polarities and is able to tolerate a positive/negative voltage that is higher than the maximum voltage allowed for the given fabrication process. It can be used to protect an I/O pin that can be exposed to a relatively wide signal swing range.

70 Claims, 10 Drawing Sheets

SYSTEMS AND METHODS FOR ESD PROTECTION

CROSS-REFERENCE TO RELATED APPLICATION

This application claims the benefit under 35 U.S.C. §119 (e) of U.S. Provisional Application No. 60/765,833, filed Feb. 7, 2006, the entirety of which is hereby incorporated by reference.

FIELD OF THE INVENTION

The invention generally relates to circuits, and in particular, to electrostatic discharge protection for circuits. Embodiments of the invention apply to all fields using Complementary Metal Oxide Semiconductor (CMOS) processes (including BICMOS where CMOS ESD clamps are used).

BACKGROUND

Description of the Related Art

Electrostatic Discharge (ESD) is a major source of reliability failures in integrated circuits (ICs). ESD arises when electrostatic charge accumulated on one object (for example a human body or a piece of equipment) is conducted onto a second object (for example a circuit board). This conduction of charge often results in damage to ICs, whether through electrical over-voltage stress or through thermal stress caused by large currents.

While it is possible to reduce the severity of an ESD transient by reducing the potential for electrostatic charge to build up (for example, by controlling humidity in lab environments), the potential can never be completely mitigated. As a result, ICs typically incorporate ESD protection structures, which allow the ICs to tolerate a certain level of ESD without creating reliability hazards. How the integrated circuit is assembled along with how the ESD protection structures are assembled is often referred to as an ESD protection strategy.

A representative ESD protection strategy, showing the protection of a device incorporating a single input/output (I/O) bond site and a single power and ground rail, is shown in FIG. 1. Three bond sites, one for the positive power supply VDD, one for the negative power supply VSS, and one for a signal, are illustrated to the left of FIG. 1. The signal is protected by primary clamp structures to both VDD and VSS. A series resistor $R_{ESP}$ and secondary positive and negative clamps further reduce the voltage seen by the I/O circuitry due to ESD from the signal. The I/O circuitry is connected to the device core circuitry. A power clamp is placed between the VDD and VSS rails. Not all ESD protection strategies will include all of these components, and more complex strategies involving multiple positive and/or negative supply rails will use more components; however the schematic of FIG. 1 illustrates representative components.

The function of the various clamps shown in FIG. 1 is to shunt ESD current seen at any pin away from the I/O and core circuitry, thereby providing a low-impedance path through the device, thereby avoiding any over-voltage stress on the I/O and core circuitry. At the same time, the clamps should be designed appropriately such that they can handle the ESD current and are not in themselves damaged by thermal over-stress from relatively large ESD currents.

Incorporation of an ESD protection strategy into an IC comes at a significant cost, both in area and in performance (speed and signal integrity). Because the various clamps are often physically large, the ESD protection strategy often is a significant fraction of the total area of an integrated circuit. Therefore, the cost of the integrated circuit is directly impacted by the requirement for ESD tolerance. Additionally, because the clamps are physically large, they often have significant parasitic capacitances, which can reduce the speed at which the signals can be driven. This parasitic capacitance also can cause signal integrity issues on signal traces due to increased reflections. Accordingly, there is a significant incentive to reduce the size of the ESD clamps.

In CMOS circuitry, four main structures are commonly used for constructing ESD clamps: Diodes; "Big FET" MOS devices; "Snapback" MOS devices; and Silicon Controlled Rectifiers (SCRs).

A diode is typically a simple and common structure. This is commonly built as a simple P-N junction (either a p-type diffusion in an n-well or an n-type diffusion in a p-well). It is simple, has a relatively high current carrying capacity per unit area, and is relatively easy to simulate. In many aspects, a diode is close to an ideal clamp, but usually only in one direction (the other direction might also clamp depending on the type of diode—for example a Zener diode would clamp in both directions, but this is not commonly used in a CMOS process). As a result, most realizable ESD protection strategies that use diodes also use one or more of the other structures.

The first structure using MOS devices for ESD clamps, known as the "Big FET" approach, uses a trigger circuit to turn on a relatively large MOS device to conduct current during the ESD transient. This approach has been used successfully to construct power clamps for many devices, and is particularly attractive from a simulation perspective because no parasitic devices are involved, and can be simulated in a standard SPICE-compatible simulator. However, a MOS device is a surface conduction device (unlike the bulk conduction of the snapback and SCR devices) and its current carrying capacity is relatively small per unit area. Because of this, the area used by the Big FET structure is often significantly larger than that used for either the snapback or SCR structures.

The second approach for ESD clamping with MOS devices involves what is called the "snapback" device. This makes use of the parasitic lateral NPN bipolar device that is inherent to NMOS devices. During an ESD transient, the parasitic NPN bipolar transistor turns on, conducting the ESD current. This bulk conduction permits it to conduct a larger current per unit area than surface-conduction structures such as a Big FET approach. The snapback device is attractive because it can be made self-triggering and can also be used as the output device for standard CMOS I/O structures, thereby making so-called "self-protecting" I/Os. However, the snapback device has a weakness: the parasitic bipolar transistor has significant variation both from device to device within a multi-finger structure, and also across the width of a single finger. These variations mean that current is typically not equally distributed across a device. Furthermore, these types of devices have a tendency to become more conductive the hotter they get, which means that unless steps are taken to prevent it, the weakest spot in the clamp can conduct a relatively large amount of ESD current, which can cause a localized failure in the clamp. In order to prevent this, a current ballast structure should be inserted into the drain of the NMOS device to ensure relatively even spreading of the ESD current. This ballast structure normally significantly increases the size of the snapback device.

Another structure commonly used for ESD clamps is a Silicon-Controlled Rectifier (SCR). It makes use of two parasitic bipolar transistors, an NPN and a PNP, and as a result an SCR has relatively large current conduction ability, which can be potentially higher than snapback devices. However, unlike the snapback device, the self-triggering voltage for a typical SCR is typically in the 10-20V range, which is typically too high for the majority of applications in fine-geometry ICs. In order to overcome this limitation, SCRs use a trigger circuit to turn on during the ESD transient, which complicates the design significantly. In addition, design of SCR circuits typically involves more simulation and testing than snapback devices, which also complicates their use.

With reference to FIG. 1, ESD clamps used at a PAD pin, e.g., the signal pin, are typically either diodes or snapback devices. In either case, a diode structure with an anode is connected to VSS, and its cathode is connected to the PAD. As a result, the voltage at the PAD pin cannot go lower than a diode drop below VSS, otherwise the diode will turn on and the signal at PAD pin will be severely affected. This could be a problem when trying to communicate between different chips when a relatively large difference in "ground" potential exists.

FIG. 2 illustrates a dual diode ESD protection scheme. ESD diodes D1 and D2 clamp the PAD pin to VDD and VSS, and also limit the signal voltage at the PAD pin to be within the range approximately defined by VDD and VSS. The power clamp between VDD and VSS is designed to effectively conduct ESD current and hold VDD and VSS together, e.g., limit a difference in potential between VDD and VSS. The power clamp can be realized by, for example, using a structure such as the snapback devices, BIGFET MOS transistor, SCR structure, or the like. The dual diode scheme is relatively effective and adds relatively little capacitance to a PAD pin, and is therefore a relatively attractive scheme for high-speed applications. However, due to the dual diode configuration, the signal voltage at the PAD pin can neither go higher than a diode drop above VDD, nor lower than a diode drop below VSS.

Conventional modern on-chip ESD protection design at the PAD pin typically only permits a positive signal above reference VSS, which is typically "ground." However, at a system level, it is possible for a relatively large "ground" potential difference to exist between or among different chips. For example, an output signal from a chip A can be well below the "ground" level of a receiving chip B. In addition, the transmitting common mode can produce signal swings outside of the power supply of the receiving chip.

In these situations, an off-chip coupling capacitor can be used to shift the common mode to a more suitable range for the receiving chip. However, both from a cost and signal integrity point of view, it is advantageous to eliminate the off-chip capacitor or integrate it on the chip.

U.S. Pat. No. 5,708,550 by Avery describes an ESD protection scheme. References numbers in this paragraph are in reference to the sole FIGURE of U.S. Pat. No. 5,708,550. Positive over-voltage tolerant capability is achieved by using a dummy supply line (15) and a Schottky diode (20). The Schottky diode blocks voltages from the input terminal that are greater than the power supply voltage. The ESD protection structure (21), together with the diode (17), discharges a positive ESD pulse at the PAD pin (11). Due to the diode (16), the potential of the signal at the PAD pin (11) does not fall below a diode drop lower than the reference potential (12).

U.S. Pat. No. 5,319,259 by Merrill describes an ESD protection scheme. References numbers in this paragraph are in reference to the FIG. 9 of U.S. Pat. No. 5,319,259. A Zener diode (91) provides ESD protection in both directions. A transistor (92) is inserted between PAD (90) and input circuit (95). It will limit the voltage supplied to the input circuit, thereby allowing voltages in excess of Vcc to serve as a legitimate logical "one" input signal to the input buffer. The signal at PAD (90) cannot go much below "ground" due to the Zener diode (91).

U.S. Pat. No. 6,424,510 by Ajit, et al., describes an ESD protection scheme. References numbers in this paragraph are in reference to the FIG. 3 of U.S. Pat. No. 6,424,510, illustrates an ESD structure that can tolerate voltages at the PAD pin, that are higher than the voltage allowed for the given technology. This is done by transistor (332) and (336). Due to a build-in parasitic diode in NMOS transistor (332), this circuit cannot tolerate high negative voltage at the PAD pin.

None of circuits described by Avery, Merrill, or Ajit in the foregoing can tolerate an input signal that falls more than a diode drop below the local VSS level, e.g., "ground" level.

U.S. Pat. No. 6,847,059 by Tsuji, et al., describes an ESD protection scheme. With reference to FIG. 1 of U.S. Pat. No. 6,847,059, a lateral PNP transistor PB and a lateral NPN transistor NB are serially connected between the input terminal and the reference potential (ground potential). With build-in parasitic diodes D1 and D3, ESD current can be conducted in both directions. The level of a positive signal capable of being input is limited by the inverse breakdown voltage, e.g., 18 to 50 V, of the diode D3, whereas the level of a negative signal capable of being input is limited by the inverse breakdown voltage, e.g., 13 to 15 V of the diode D1.

SUMMARY

One embodiment of the invention advantageously provides on-chip ESD protection. An ESD structure within an integrated circuit provides protection for other circuits of the integrated circuit against negative-going ESD transients. In one embodiment, the ESD structure is combined with other circuitry to provide protection from positive-going ESD events. In one embodiment, the negative voltage-tolerance ESD structure is implemented with PMOS devices. In another embodiment, the ESD structure is implemented with NMOS devices. In addition, certain embodiments of the invention also load the node that is protected with relatively little capacitance, which can thereby enhance the performance of circuits coupled to that node.

One embodiment is an integrated circuit with electrostatic discharge (ESD) protection, wherein the integrated circuit includes: a node operatively coupled to a pad and to an operational circuit of the integrated circuit, wherein the operational circuit is to be protected from ESD; a diode having an anode and a cathode, wherein the cathode is coupled to the node; and two or more PMOS transistors arranged in series, the two or more PMOS transistors comprising at least a first PMOS transistor and a second PMOS transistor, the first PMOS transistor having a drain, a gate, and a source, the second PMOS transistor having a drain, a gate, and a source, wherein the drain of the first PMOS transistor is coupled to the anode of the diode, wherein the source of the second PMOS transistor is coupled to the first voltage reference terminal, wherein the source of the first PMOS transistor is coupled, directly or indirectly, to the drain of the second PMOS transistor, and wherein the gates of the PMOS transistors are coupled to voltage reference(s) so that the PMOS transistors are "off" when voltage at the node is less than voltage at the first voltage reference terminal.

One embodiment is an integrated circuit with electrostatic discharge (ESD) protection, wherein the integrated circuit includes: a node operatively coupled to a pad and to an operational circuit of the integrated circuit, wherein the operational circuit is to be protected from ESD; a diode having an anode and a cathode, wherein the anode is coupled to a first voltage reference terminal; and two or more PMOS transistors arranged in series, the two or more PMOS transistors comprising at least a first PMOS transistor and a second PMOS transistor, the first PMOS transistor having a drain, a gate, and a source, the second PMOS transistor having a drain, a gate, and a source, wherein the drain of the first PMOS transistor is coupled to the node, wherein the source of the second PMOS transistor is coupled to the cathode of the diode, wherein the source of the first PMOS transistor is coupled, directly or indirectly, to the drain of the second PMOS transistor, and wherein gates of the PMOS transistors are coupled to voltage reference(s) so that the PMOS transistors are "off" when voltage at the node is less than voltage at the first voltage reference terminal.

One embodiment is an integrated circuit with electrostatic discharge (ESD) protection, wherein the integrated circuit includes: a node operatively coupled to a pad and to an operational circuit of the integrated circuit, wherein the operational circuit is to be protected from ESD; a diode having an anode and a cathode, wherein the cathode is coupled to the node; and a PMOS transistor having a gate, a drain, and a source, wherein the drain of the PMOS transistor is coupled to the anode of the diode, wherein the source of the PMOS transistor is coupled to a first voltage reference terminal, wherein the gate of the PMOS transistor is coupled to a reference voltage so that the PMOS transistor is "off" when voltage at the node is less than voltage at the first voltage reference terminal.

One embodiment is an integrated circuit with electrostatic discharge (ESD) protection, wherein the integrated circuit includes: a node operatively coupled to a pad and to an operational circuit of the integrated circuit, wherein the operational circuit is to be protected from ESD; a diode having an anode and a cathode, wherein the anode is coupled to a first voltage reference terminal; and a PMOS transistor having a gate, a drain, and a source, wherein the drain of the PMOS transistor is coupled to the node, wherein the source of the PMOS transistor is coupled to the cathode of the diode, wherein the gate of the PMOS transistor is coupled to a reference voltage so that the PMOS transistor is "off" when voltage at the node is less than voltage at the first voltage reference terminal.

One embodiment is an integrated circuit with electrostatic discharge (ESD) protection, wherein the integrated circuit includes: a node operatively coupled to a pad and to an operational circuit of the integrated circuit, wherein the operational circuit is to be protected from ESD; a diode having an anode and a cathode, wherein the cathode is coupled to the node; and two or more NMOS transistors arranged in series, the two or more NMOS transistors comprising at least a first NMOS transistor and a second NMOS transistor, the first NMOS transistor having a drain, a gate, and a source, the second NMOS transistor having a drain, a gate, and a source, wherein the source of the first NMOS transistor is coupled to the anode of the diode, wherein the drain of the second NMOS transistor is coupled to the first voltage reference terminal, wherein the drain of the first NMOS transistor is coupled, directly or indirectly, to the source of the second NMOS transistor, and wherein gates of the NMOS transistors are coupled to voltage reference(s) so that the NMOS transistors are "off" when voltage at the node is less than voltage at the first voltage reference terminal.

One embodiment is an integrated circuit with electrostatic discharge (ESD) protection, wherein the integrated circuit includes: a node operatively coupled to a pad and to an operational circuit of the integrated circuit, wherein the operational circuit is to be protected from ESD; a diode having an anode and a cathode, wherein the cathode is coupled to the node; and an NMOS transistor having a gate, a drain, and a source, wherein the source of the NMOS transistor is coupled to the anode of the diode, wherein the drain of the NMOS transistor is coupled to a first voltage reference terminal, wherein the gate of the NMOS transistor is coupled to a reference voltage so that the NMOS transistor is "off" when voltage at the node is less than voltage at the first voltage reference terminal.

BRIEF DESCRIPTION OF THE DRAWINGS

These drawings and the associated description herein are provided to illustrate specific embodiments of the invention and are not intended to be limiting.

DETAILED DESCRIPTION OF EMBODIMENTS

An on-chip ESD protection network at a PAD pin or other interconnect preferably tolerates large signal swings in both positive/negative directions, and has relatively good ESD performance. In one embodiment, an ESD protection structure in a signal path between a PAD and VSS can sustain a relatively high negative voltage at the PAD pin and can discharge the ESD current from VSS to the PAD pin. Advantageously, the ESD protection structure can also tolerate a positive voltage higher than the maximum breakdown voltage of a gate oxide for the particular process used.

PMOS Approach

Figure 1:
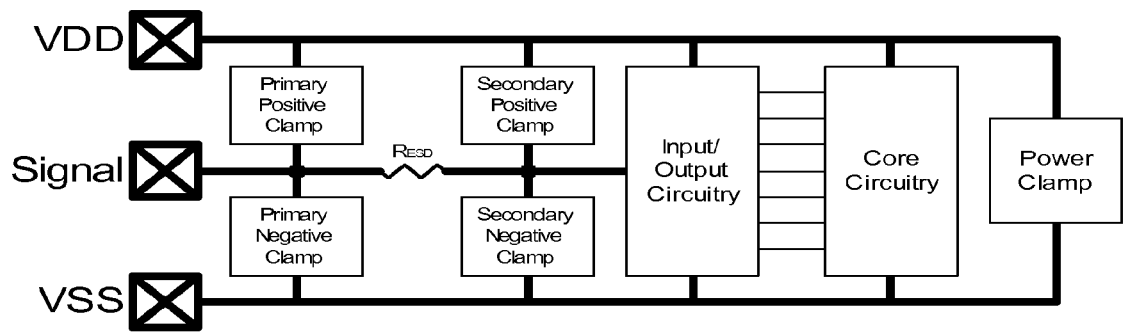
FIG. 1 is a schematic that illustrates a representative ESD protection strategy.
Figure 2:
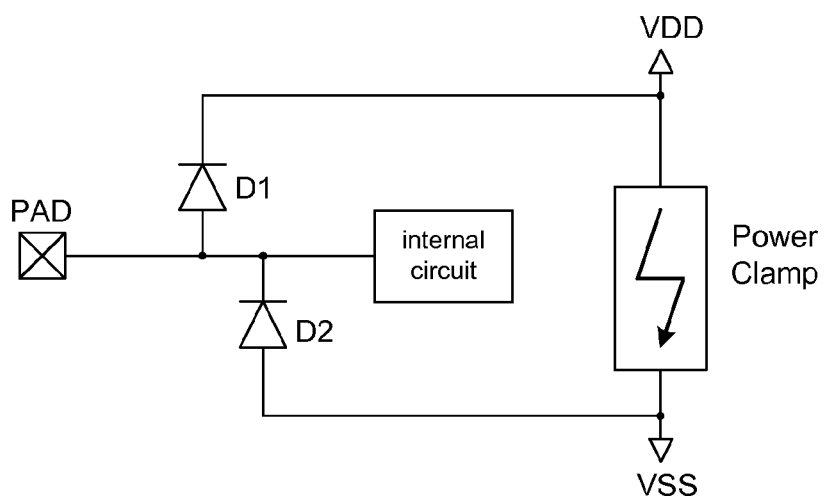
FIG. 2 is a schematic that illustrates a dual diode ESD protection scheme.
Figure 3A:
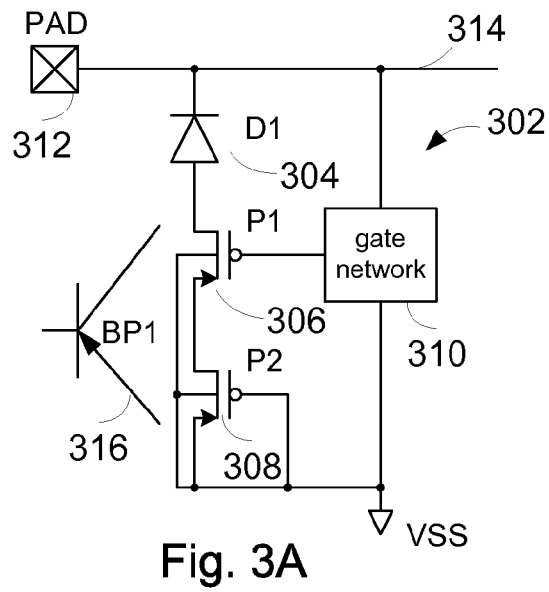
FIG. 3A is a schematic illustrating an embodiment of an ESD protection structure implemented with PMOS.
Figure 3B:
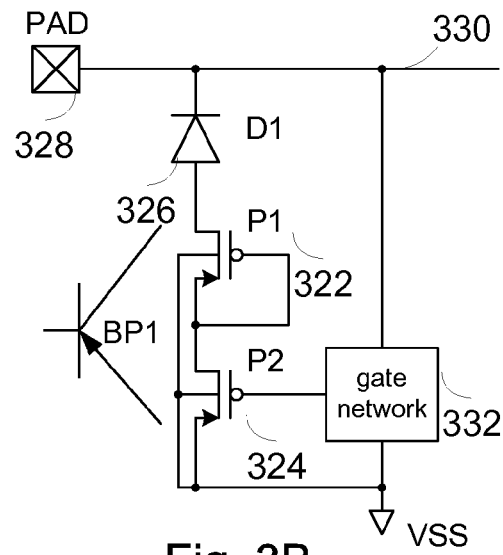
FIG. 3B is a schematic illustrating an embodiment of an ESD protection structure implemented with PMOS.
Figure 3C:
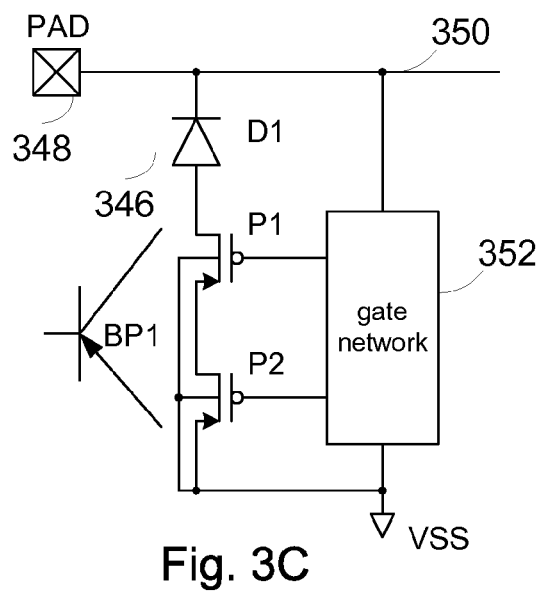
FIG. 3C is a schematic illustrating an embodiment of an ESD protection structure implemented with PMOS.
Figure 3D:
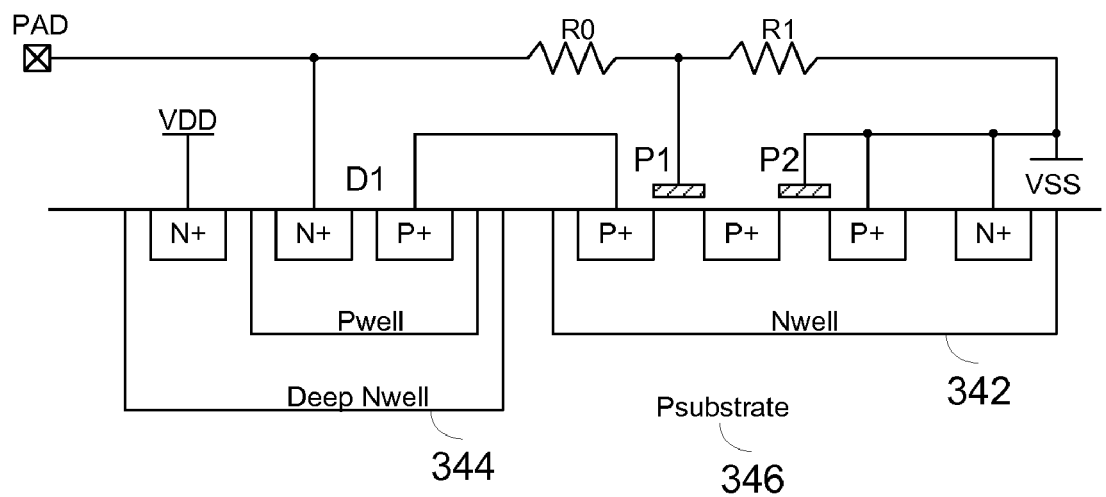
FIG. 3D is an example of a cross-section for the schematic illustrated in FIG. 3A.

FIGS. 3A, 3B, and 3C are schematics and FIG. 3D illustrates a cross section for ESD protection structures with PMOS devices. The schematics are more than mere extensions from NMOS to PMOS of some other scheme (such as a diode in series with a single/cascade NMOS power clamp). Based on experiences with older CMOS processes, PMOS was not believed to be capable of snapping back or was believed to snap back relatively poorly. For these reasons, NMOS has been used to implement snapback clamping structures. However, experimental results indicate that with modern CMOS processes, new PMOS devices do snap back and the snap back performance is comparable with NMOS. PMOS provides relatively good ESD performance, and the bulk of a PMOS device is isolated from the substrate and does not necessarily need a deep Nwell, which would be used if an NMOS configuration were used instead. The absence of a deep Nwell can decrease production cost.

The structure illustrated FIG. 3A will now be described. The ESD structure 302 includes a diode D1 304, a first PMOS transistor P1 306, a second PMOS transistor P2 308, and a gate network 310. A pad 312 is illustrated to the left, and a circuit to be protected is coupled to a node 314. A cathode of the diode D1 304 is coupled to the node 314. An anode of the diode D1 304 is coupled to a drain of the first PMOS transistor P1 306. A source of the first PMOS transistor 306 is coupled to a drain of the second PMOS transistor P2 308. A source of the second PMOS transistor P2 308 is coupled to the VSS reference potential. The schematic also illustrates a parasitic PNP bipolar transistor BP1 316.

During normal operation, when a voltage applied to the PAD 312 is higher than VSS, e.g., ground, diode D1 304 is reversed biased, and there is relatively little or no leakage current from the PAD 312 to VSS. When a negative voltage is applied to the PAD pin 312, diode D1 304 is forward biased and PMOS transistor P1 306 can be partially turned on due to the gate network 310, and PMOS transistor P2 308 is in an "off" state since its gate is hard tied to its source. Therefore, the leakage is also reduced or minimized in this situation. The gate network 310 reduces a voltage for the "gate" of the PMOS transistor P1 306, so that the gate-oxide of the PMOS transistor P1 306 will not be overstressed even when the voltage applied to the PAD pin 312 exceeds the maximum voltage typically allowed by the particular process. In one embodiment, the gate network 310 generates a voltage that is in-between the voltage of the PAD 312 and VSS. In one embodiment, the gate network 310 is implemented with a voltage divider using two resistors as illustrated in the cross-section of FIG. 3D. An inner terminal between the two (or more) resistors provides an output voltage of the voltage divider. However, other methods of limiting voltage to a safe voltage will be readily determined by one of ordinary skill in the art, such as, for example, a circuit with a Zener diode and a resistor.

Due to the stacked PMOS transistors P1, P2 306, 308 and the diode D1 304, this structure 302 is able to sustain both positive and negative voltages having absolute values that are higher than the maximum voltage allowed by the particular process (as typically a reverse biased diode breakdown is much higher than that of the MOS devices in the process). For example, if the PMOS transistors P1, P2 306, 308 are realized by PMOS transistors for a 3.3 V process, then the structure can tolerate up to +5V signal and protect the circuit coupled to the node 314 when the signal goes below −5V at the PAD pin. In another example, when using PMOS transistors for a 1.8 V process, the illustrated structure can tolerate up to a signal up to +3.35 V and protect the other circuit when the signal goes below −3.3 V at the PAD pin 312. This provides relatively good flexibility at the system level design.

When an ESD event, e.g., a "zap" or transient, that is negative with respect to VSS appears at PAD pin 312, the diode D1 304 will be forward biased and will pull the drain of PMOS transistor P1 306 low. Once the drain of PMOS transistor P1 306 is pulled low enough and reaches its trigger voltage, the parasitic PNP bipolar BP1 316, formed by the source of PMOS transistor P2 308, the Nwell 342 (FIG. 3D) for the PMOS transistors P1, P2 306, 308, and the drain of PMOS transistor P1 306, will be turned on to provide bulk conduction. Together with the forward biased diode D1 304, this will form a low impedance ESD discharge path from VSS to the PAD 312. This bulk conduction of the ESD current through the parasitic PNP bipolar transistor BP1 is used in all of the ESD structures illustrated in FIGS. 3A-3C, 4A-4D, and 5A-5E. In the illustrated embodiments, the circuits are configured to provide gate voltages for the PMOS transistors in FIGS. 3A-3C, 4A-4D, and 5A-5E that prevent the PMOS transistors from turning "on."

However, when a positive ESD transient is applied at the PAD pin 312, the ESD current does not flow from the PAD 312 to VSS due to the reverse bias at diode D1 304. Another ESD structure can be used to form a discharge path for this positive-going ESD event, which will be addressed later in connection with FIGS. 8-11.

FIG. 3B illustrates an alternative configuration wherein the "gates" of PMOS transistors P1, P2 322, 324 are connected differently, but otherwise, the principles and advantages previously described remain applicable. In FIG. 3B, the gate of P1 is tied to its source, and the gate of P2 is connected to a gate network 332. In the embodiment of FIG. 3C, the gates of both P1 and P2 are connect to a gate network 352. It will be understood that depending the illustrated gate network 352 in FIG. 3C can be formed by two separate networks or a by a single gate network. In one embodiment, the gate network 352 is formed by a three-resistor voltage divider, with the outputs of the gate networks 352 coupled from the nodes between resistors.

In the embodiments of FIGS. 3A, 3B, and 3C, since diode D1 304, 326, 346, is directly connected to the PAD pin 312, 328, 348, a deep Nwell 344 (FIG. 3D) is formed to isolate the cathode node of D1 304, 326, 346 from the substrate 346 (FIG. 3D), which is at the VSS potential. It also advantageously has low capacitance on the pad node 314, 330, 350 due to the diode D1 304, 326, 346.

In another embodiment, the deep Nwell 344 is not formed, and diode D1 304, 326 is formed relatively close to VSS rather than to the PAD 328. However, with the diode D1 304, 326 formed relatively close to VSS, the capacitance on the pad node 330 will typically be greater. FIGS. 4A-4D illustrate examples of alternative configurations without the deep Nwell 344 (FIG. 3D), and FIG. 4E illustrates an example of a cross section for the schematic of FIG. 4A. The principles of operation remain applicable, but the ESD structures can be produced without the extra cost of the deep Nwell 344 (FIG. 3D).

Figure 4A:
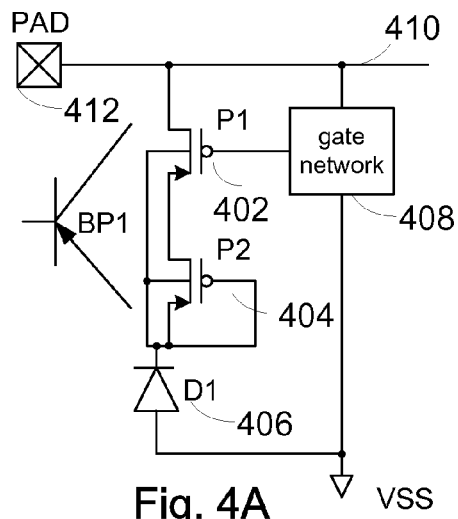
FIG. 4A is a schematic illustrating an embodiment of an ESD protection structure implemented with PMOS without a deep Nwell.

The ESD structure of FIG. 4A includes a first PMOS transistor P1 402, a second PMOS transistor P2 404, a diode D1 406, and a gate network 408. The ESD structure provides protection from transients for circuits coupled to the node 410. In the embodiment illustrated in FIG. 4A, the drain of the first PMOS transistor P1 402 is coupled to the node 410. The node 410 is coupled to the pad 412. The gate of the first PMOS transistor P1 402 is coupled to a gate network 408, which provides a voltage for the gate that keeps the PMOS transistor P1 from turning on. A parasitic PNP bipolar transistor BP1 is present in the embodiments illustrated in FIGS. 4A and 4B, the conduction of currents for ESD is via the parasitic PNP bipolar transistor BP1. The gate network 408 is coupled to the node 410 and to a voltage reference VSS, such as ground. In one embodiment, the gate network 408 is a voltage divider.

Figure 4B:
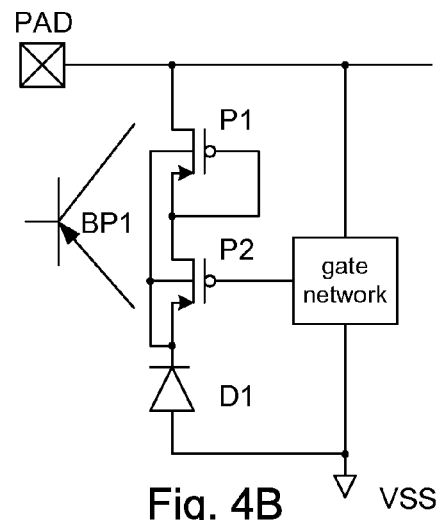
FIG. 4B is a schematic illustrating an embodiment of an ESD protection structure implemented with PMOS without a deep Nwell.
Figure 4C:
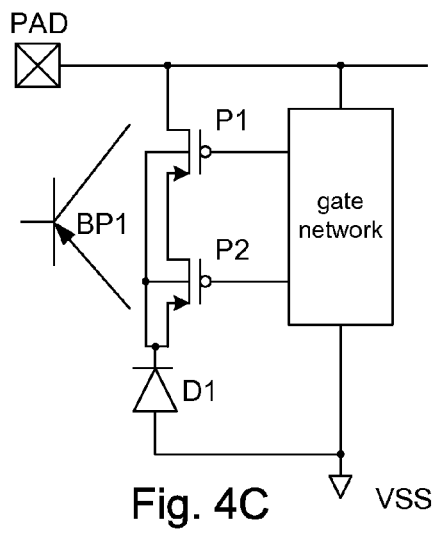
FIG. 4C is a schematic illustrating an embodiment of an ESD protection structure implemented with PMOS without a deep Nwell.
Figure 4D:
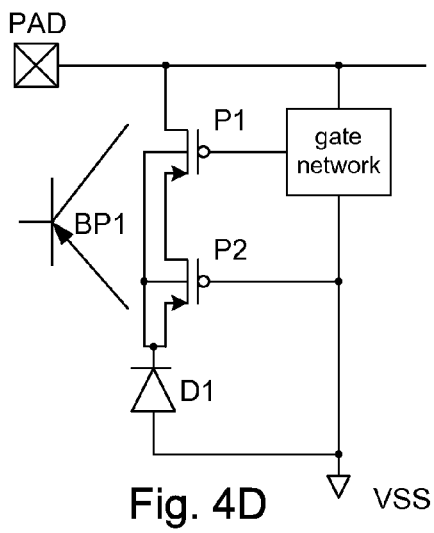
FIG. 4D is a schematic illustrating an embodiment of an ESD protection structure implemented with PMOS without a deep Nwell.
Figure 4E:
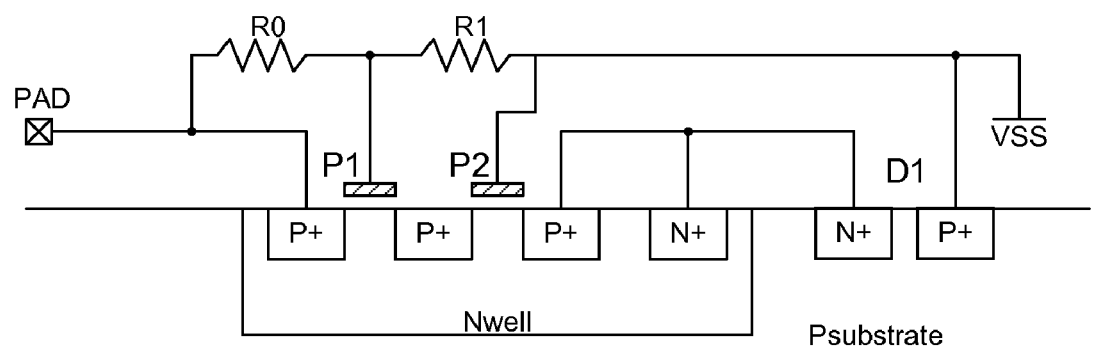
FIG. 4E is an example of a cross-section for the schematic illustrated in FIG. 4A.

The source of the first PMOS transistor P1 402 is coupled to a drain of the second PMOS transistor 404. In one embodiment, additional PMOS transistors are present in series between the source of the first PMOS transistor P1 402 and the second PMOS transistor 404. The gate of the second PMOS transistor P2 404 is coupled to the source, and keeps the second PMOS transistor P2 404 turned off. The source of the second PMOS transistor 404 is coupled to the cathode of the diode D1 406. The anode of the diode D1 is coupled to the voltage reference VSS. FIG. 4B illustrates a similar embodiment to that of FIG. 4A, but with different gate connections, with P1 having a tied gate-source, and with P2 being coupled to a gate network. In the embodiment of FIG. 4C, both P1 and P2 have gates tied to terminals of a gate network. In the embodiment of FIG. 4D, the gate of P2 is tied to the voltage reference VSS, which can be ground.

Figure 5A:
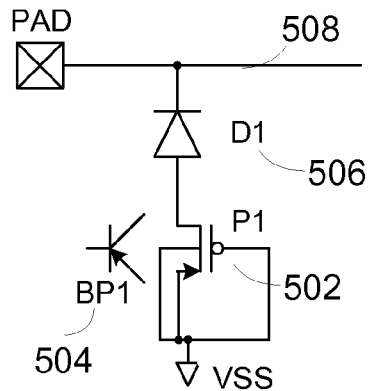
FIG. 5A is a schematic illustrating an embodiment of an ESD protection structure implemented with a PMOS transistor and a diode.
Figure 5B:
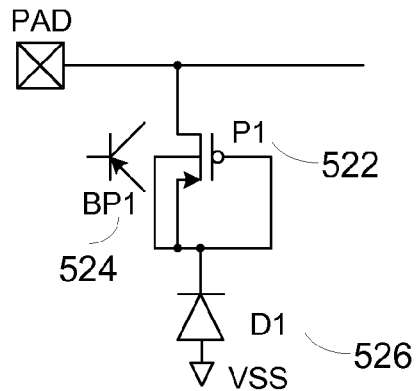
FIG. 5B is a schematic illustrating an embodiment of an ESD protection structure implemented with a PMOS transistor and a diode.
Figure 5C:
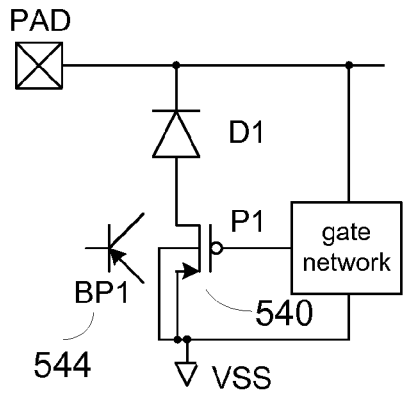
FIG. 5C is a schematic illustrating an embodiment of an ESD protection structure implemented with a PMOS transistor and a diode.
Figure 5D:
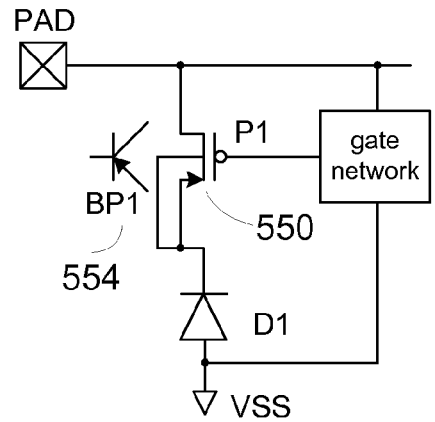
FIG. 5D is a schematic illustrating an embodiment of an ESD protection structure implemented with a PMOS transistor and a diode.
Figure 5E:
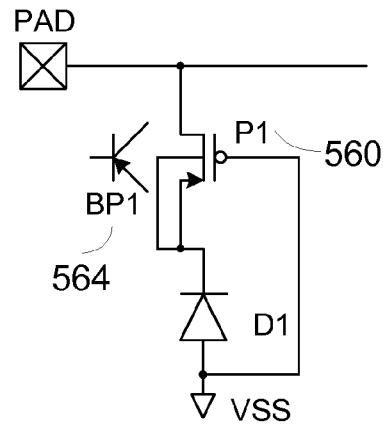
FIG. 5E is a schematic illustrating an embodiment of an ESD protection structure implemented with a PMOS transistor and a diode.

When over-voltage tolerance capability is not needed, the circuits described earlier in connection with FIGS. 3A-3C, and 4A-4D can be simplified. For example, the circuits of FIGS. 5A-5D illustrate examples of single PMOS transistor 502, 522, 540, 550, 560 circuits. For transistors formed from a 3.3 V or a 1.8 V process, these circuits are able to handle about a +/−3.3 V or a +/−1.8 V signal voltage, respectively. The parasitic PNP bipolar transistor BP1 504, 524, 544, 554, 564 is again present as illustrated in FIGS. 5A-5E and conducts current for the handling of an ESD transient of negative voltage. In the illustrated embodiments, the gate of the PMOS transistor P1 502, 522 in either of the embodiments of FIG. 5A or 5B is tied to the source of the PMOS transistor P1 502, 522, so that the PMOS transistor P1 502, 522 is "off" with a negative going transient. In another embodiment, the gate is tied to a gate network as shown by, for example, FIGS. 5C and 5D. In another embodiment, the gate of P1 560 is tied to a voltage reference VSS, such as ground. Diode D1 506, 526 reverse biases for positive voltages on the node 508, 528. The cathode of diode D1 506 (FIG. 5A) is coupled directly to the node 508, whereas diode D1 526 (FIG. 5B) is coupled directly to the voltage reference VSS.

In another embodiment, more than 2 PMOS devices can be cascaded in series to tolerate even higher voltages than those described for the dual PMOS transistor circuits of FIG. 3A-3C, or 4A-4D. In addition, the gate network 310 can also be extended to provide control or limiting of the gate voltages of the cascaded transistors.

NMOS Approach

Figure 6A:
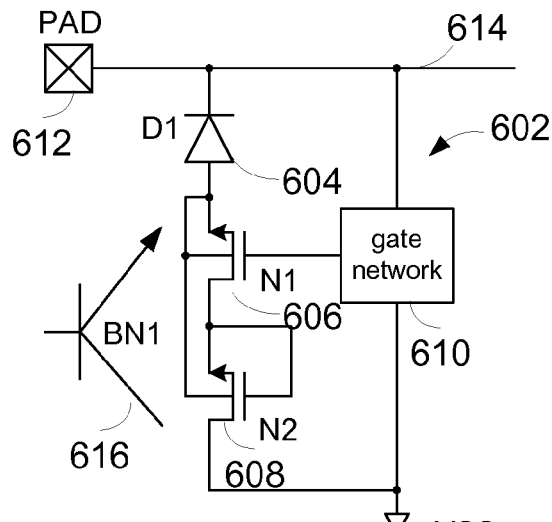
FIG. 6A is a schematic illustrating an embodiment of an ESD protection structure implemented with NMOS.
Figure 6B:
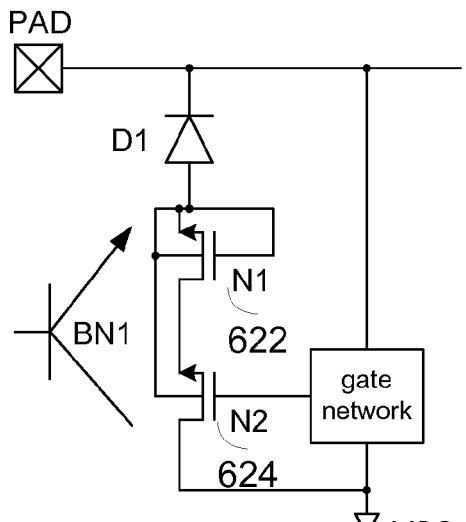
FIG. 6B is a schematic illustrating an embodiment of an ESD protection structure implemented with NMOS.
Figure 6C:
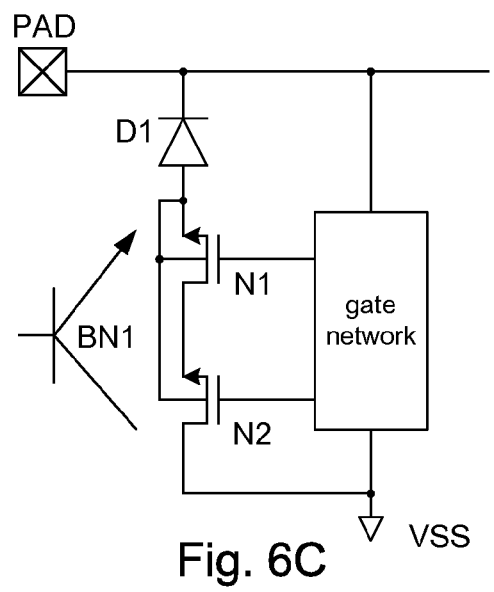
FIG. 6C is a schematic illustrating an embodiment of an ESD protection structure implemented with NMOS.

FIGS. 6A-6C illustrate examples of ESD protection techniques using NMOS. These techniques can be used when a deep Nwell is available and PMOS protection is not desired.

The ESD protection structure 602 illustrated in FIG. 6A includes a diode D1 604, a first NMOS transistor N1 606, a second NMOS transistor N2 608, and a gate network 610. A pad 612 is illustrated to the left, and a circuit to be protected is coupled to a node 614. The schematic also illustrates a parasitic NPN bipolar transistor BN1 616.

During normal operation, when voltage applied to the PAD 612 is higher than VSS, e.g., ground, diode D1 604 is reversed biased, and relatively little or no leakage current flows from the PAD 612 to VSS. When a negative voltage is applied to the PAD pin 612, diode D1 604 is forward biased, NMOS transistor N1 606 can be partially turned on due to the gate network 610, and NMOS transistor N2 608 is in an off state since its gate is hard tied to its source. Therefore, the leakage is also minimized in this negative voltage situation. The gate network 610 provides a voltage for the gate of the NMOS transistor N1 606, so that the gate-oxide of the NMOS transistor N1 606 will not be over stressed even if voltage applied to the PAD pin 612 exceeds the maximum voltage allowed by the particular process. One implementation of the gate network 610 is a voltage divider with two resistors; however those of ordinary skill in the art will readily determine other methods of limiting voltage to safe limits. For example, even a Zener diode and a resistor circuit can be used.

Due to the stacked NMOS transistor N1, N2 606, 608 design and the diode D1 640, the structure 602 illustrated in FIG. 6A is able to tolerate both positive and negative signal voltages with an absolute value that is higher than the maximum voltage allowed by the particular process (as typically a reverse biased diode breakdown is much higher than the MOS devices in the process). However, the structure illustrated in FIG. 6A provides protection for a circuit coupled to the node 614 only in the negative direction.

When an ESD transient occurs at the PAD pin 614 and is negative with respect to VSS, diode D1 604 is forward biased, and pulls the "bulk" of NMOS transistors N1, N2 606, 608 low. Once the "bulk" of the NMOS transistors N1, N2 606, 608 is pulled low enough and reaches its trigger voltage, the parasitic NPN bipolar transistor BN1 616 is turned on. Accordingly, the current for the transient is handled by the parasitic NPN bipolar transistor BN1 616 rather than the NMOS. This also applies to the embodiment to be described later in connection with FIG. 7.

The parasitic NPN bipolar transistor BN1 616 is formed by the drain of NMOS transistor N2 602, a Pwell, and the source of NMOS transistor N1 606. Together with the forward biased diode D1 604, this forms a low impedance ESD discharge path from VSS to the PAD 612. However, when a positive ESD transient is applied at the PAD pin 612, the ESD current will not flow from PAD 612 to VSS due to the reverse-bias at diode D1 604. Therefore, another ESD structure is used to provide a discharge path in this positive ESD event, and will be discussed later in connection with FIGS. 8-11.

It should be noted that in contrast to the PMOS scheme, there would be no advantage to moving the diode D1 604 to the other side of the NMOS transistors, i.e., to the VSS side, as the NMOS transistors 606, 608 still use a deep Nwell and the parasitic capacitance on the node 614 would be relatively high.

FIG. 6B illustrates an alternative configuration wherein the gates of NMOS transistors N1, N2 622, 624 are connected differently, but the principles and advantages are the same. FIG. 6B also illustrates the presence of the parasitic NPN bipolar transistor BN1. FIG. 6C illustrates an alternative configuration wherein the gates of the NMOS transistors N1, N2 are connected to a gate network. In one embodiment, the gate network is formed by a 3-resistor voltage divider.

Figure 7A:
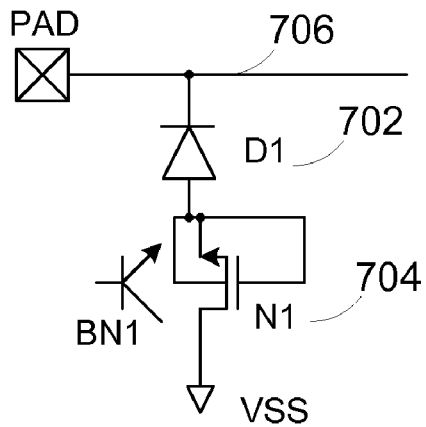
FIG. 7A is a schematic illustrating an embodiment of an ESD protection structure implemented with a diode and a single NMOS transistor.
Figure 7B:
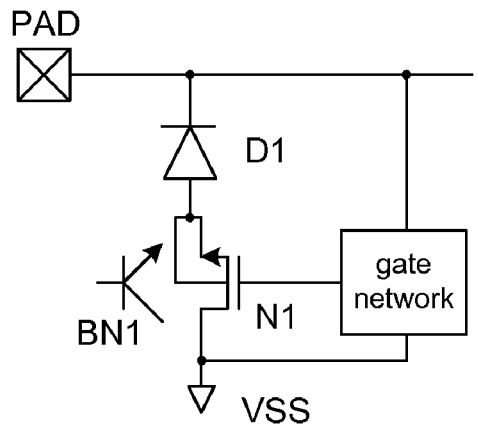
FIG. 7B is a schematic illustrating an embodiment of an ESD protection structure implemented with a diode and a single NMOS transistor.
Figure 8:
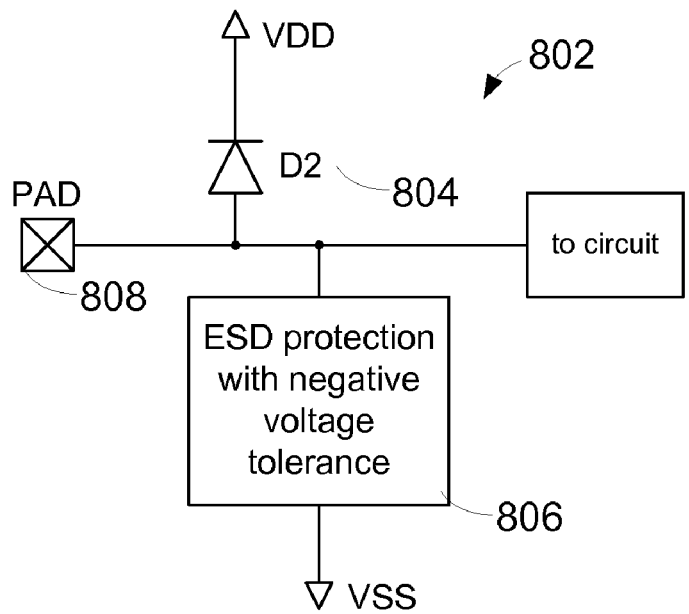
FIG. 8 is a schematic illustrating an ESD protection structure combined with a positive voltage clamp formed by a diode.

When over-voltage tolerance capability is not needed, the circuits of FIGS. 6A and 6B can be simplified, as shown in FIGS. 7A and 7B. The configuration of FIG. 7A includes a diode D1 702 and an NMOS transistor N1 704. The cathode of the diode D1 702 is coupled to a node 706, which is coupled to the PAD. The anode of the diode D1 702 is coupled to a source of the NMOS transistor N1 704. The gate and source of the NMOS transistor N1 704 are tied together. The drain of the NMOS transistor N1 704 is coupled to VSS, which can be ground potential. FIG. 7A also illustrates the presence of the parasitic NPN bipolar transistor BN1. In another embodiment, additional NMOS devices, i.e., more than 2 NMOS devices, can be cascaded in series to tolerate even higher voltages. The embodiment of FIG. 7B is similar, but with the gate of an NMOS transistor N1 coupled to a gate network.

Figure 9:
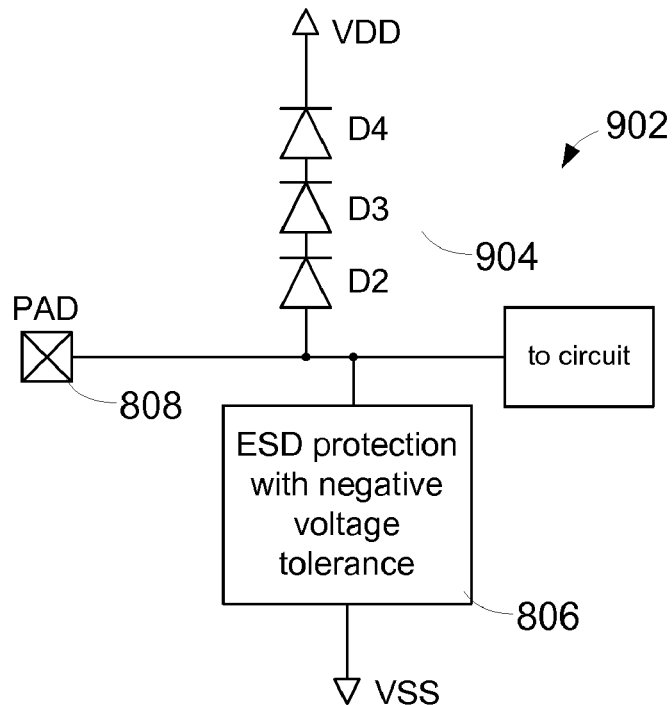
FIG. 9 is a schematic illustrating an ESD protection structure combined with a positive voltage clamp formed by a stack of diodes.

The structures discussed in connection with FIGS. 3A-3C provide an ESD discharge path for a negative-going ESD transient at the PAD pin 312, 328. However, to realize full ESD protection, a positive-going ESD transient at the PAD pin also should be discharged, for example, to VSS or to VDD. Full ESD protection networks will now be described. In these examples, the block 806, labeled "ESD protection with negative voltage tolerance" refers to any the structures described earlier in connection with FIGS. 3A-3C, 4A-4D, 5A-5E, 6A-6C, 7A, and 7B FIG. 8 shows a complete ESD protection network 802 including an ESD diode D2 804 and the ESD protection with negative voltage tolerance block 806. In this scheme, a positive ESD transient at the PAD pin 808 is discharged to VDD power supply through D2. Due to the use of a single diode D2 804 clamp to VDD, the maximum positive voltage at the PAD pin 808 cannot be more than a diode drop higher than the voltage at VDD, and can also be limited by the particular configuration used in the ESD protection with negative voltage tolerance block 806. FIG. 9 illustrates a similar configuration to that of FIG. 8, but with a stack 904 of two or more diodes in place of the single diode D2 804 to increase the maximum sustainable voltage at the PAD pin 808. Either the diode D2 804 (FIG. 8) or the diode stack 904 can form a diode group of one or more diodes with an anode and a cathode.

For example, two or more diodes can be stacked as illustrated by the 3-diode stack 904 of FIG. 9. Other numbers of diodes will be readily determined by one of ordinary skill in the art. The triple stacked diode chain D2, D3, D4 904 is used to discharge positive ESD transient from the PAD 808 to the VDD supply. Although the triple diode stack 904 increases the voltage tolerance level at the PAD pin 808, the maximum allowed positive voltage may also be limited by the particular ESD protection with negative voltage tolerance block 806.

Figure 10:
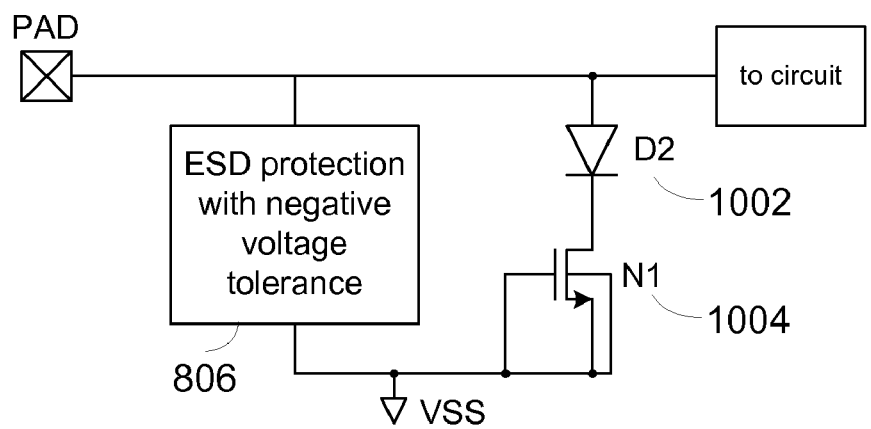
FIG. 10 is a schematic illustrating an ESD protection structure combined with a positive voltage clamp formed by a clamp to VSS.

FIG. 10 illustrates an alternative configuration wherein an ESD diode D2 1002 is used in series with an NMOS transistor N1 1004 to discharge a positive ESD transient to VSS. In this scheme, the maximum absolute voltage allowed at the PAD pin is determined by the gate-oxide breakdown voltage of NMOS transistor N1 1004 (from a reliability point of view) or by a sum of a trigger voltage of snapback NMOS transistor N1 1004 and a diode drop voltage from diode D2.

Figure 11:
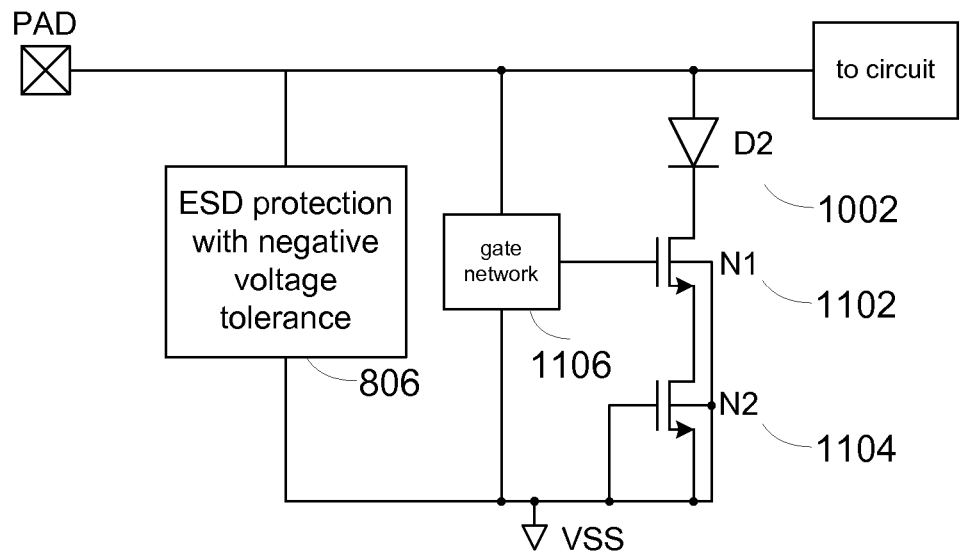
FIG. 11 is a schematic illustrating an ESD protection structure combined with a positive voltage clamp formed by a clamp to VSS that includes a stack of transistors.

The NMOS transistor N1 1004 from FIG. 10 can be replaced by a stacked combination. In FIG. 11, NMOS transistor N1, N2 1102, 1104 are used in series with diode D2 1002 to increase the voltage tolerance level at the PAD pin. A gate network 1106 can be shared for the NMOS transistor 1102 and a transistor from the block 806. Again, the voltage tolerance level at PAD pin is increased by the series combination of the NMOS transistors N1, N2 1102, 1104.

The relatively few simple configurations described in the foregoing illustrate general principles and advantages of embodiments of the invention. Other configurations and modifications will readily be determined by one of ordinary skill in the art.

Figure 12:
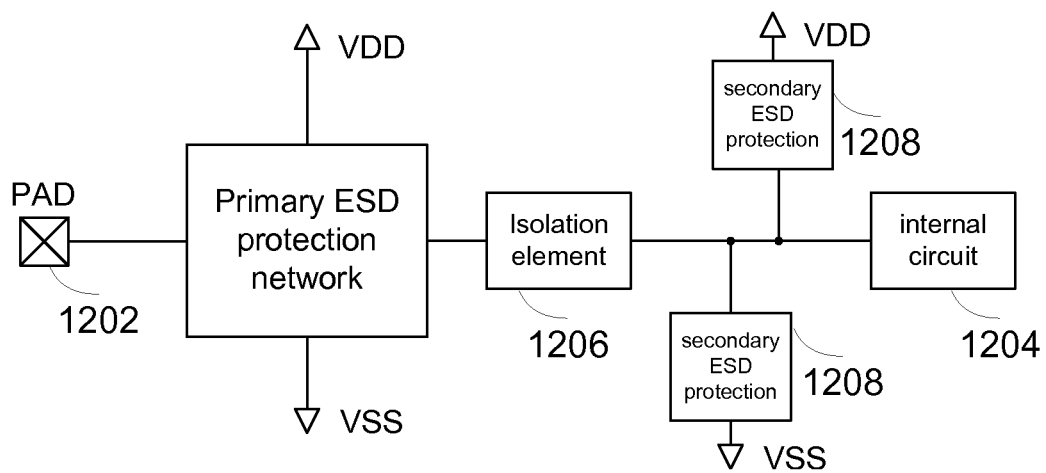
FIG. 12 illustrates an example of further isolation of the internal circuit from the effects of ESD.

FIG. 12 illustrates an example of further isolation of the internal circuit from the effects of ESD. The PAD node 1202 can experience a relatively high-voltage swing, and the internal circuit 1204 can be isolated from this swing. For example, an isolation element 1206 together with secondary ESD protection 1208 can be used. Common isolation elements 1208 are resistors, coupling capacitors, pass gate transistors, or a combination of them. The secondary ESD protection 1208 can be realized by diodes, snapback devices or some other ESD protection devices.

The ESD protection schemes described herein can be used to permit relatively large negative input voltages at a chip pin without requiring external components, and can reduce cost and improve signal integrity.

Various embodiments have been described above. Although described with reference to these specific embodiments, the descriptions are intended to be illustrative and are not intended to be limiting. Various modifications and applications may occur to those skilled in the art without departing from the true spirit and scope of the invention as defined in the appended claims.

What is claimed is:

1. An integrated circuit with electrostatic discharge (ESD) protection, the integrated circuit comprising:
   a node operatively coupled to a pad and to an operational circuit of the integrated circuit, wherein the operational circuit is to be protected from ESD;
   a diode having an anode and a cathode, wherein the cathode is coupled to the node; and
   two or more PMOS transistors arranged in series, the two or more PMOS transistors comprising at least a first PMOS transistor and a second PMOS transistor, the first PMOS transistor having a drain, a gate, and a source, the second PMOS transistor having a drain, a gate, and a source, wherein the drain of the first PMOS transistor is coupled to the anode of the diode, wherein the source of the second PMOS transistor is coupled to a first voltage reference terminal, wherein the source of the first PMOS transistor is coupled, directly or indirectly, to the drain of the second PMOS transistor, and wherein the gates of the PMOS transistors are coupled to voltage reference(s) so that at least one of the PMOS transistors is "off" when voltage at the node is less than voltage at the first voltage reference terminal.

2. The integrated circuit of claim 1, wherein the first voltage reference terminal is for ground.

3. The integrated circuit of claim 1, wherein the source of the first PMOS transistor is coupled directly to the drain of the second PMOS transistor.

4. The integrated circuit of claim 1, further comprising a third PMOS transistor, wherein the source of the first PMOS transistor is coupled indirectly to the drain of the second PMOS transistor via the third PMOS transistor in series between the first PMOS transistor and the second PMOS transistor, the third PMOS transistor having a gate, a drain, and a source, the drain of the third PMOS transistor coupled to the source of the first PMOS transistor, the source of the third PMOS transistor coupled to the drain of the second PMOS transistor.

5. The integrated circuit of claim 1, further comprising a gate network coupled to the node and to the first voltage reference terminal, wherein the gate network is configured to generate at least one output voltage between that of the node and the first voltage reference terminal as a reference voltage (s) for at least one of the PMOS transistors.

6. The integrated circuit of claim 5, wherein the gate of the first PMOS transistor is coupled to the gate network, and wherein the gate of the second PMOS transistor is coupled to the source of the second PMOS transistor.

7. The integrated circuit of claim 5, wherein the gate of the first PMOS transistor is coupled to the source of the first PMOS transistor, and wherein the gate of the second PMOS transistor is coupled to the gate network.

8. The integrated circuit of claim 5, wherein the gates of both the first PMOS transistor and the second PMOS transistor are coupled to respective outputs of the gate network.

9. The integrated circuit of claim 5, wherein the gate network comprises a voltage divider, and wherein the at least one output voltage is tapped from an inner terminal of the voltage divider.

10. The integrated circuit of claim 1, further comprising a diode group comprising one or more diodes, the diode group having an anode and a cathode, wherein the anode is coupled to the node, wherein the cathode is coupled to a second voltage reference terminal that is intended to be at a higher voltage potential than a voltage of the first voltage reference terminal.

11. The integrated circuit of claim 1, further comprising a diode group comprising a second diode and an NMOS transistor, the second diode having an anode and a cathode, the NMOS transistor having a gate, a drain, and a source, wherein the anode is coupled to the node, wherein the cathode is coupled to the drain of the NMOS transistor, and wherein the gate and the source are coupled to the first voltage reference terminal.

12. The integrated circuit of claim 11, wherein the NMOS transistor comprises a stack of NMOS transistors, wherein at least one of the NMOS transistors in the stack has a gate that is coupled to the output of the gate network.

13. The integrated circuit of claim 1, wherein the integrated circuit further comprises a deep Nwell for isolation of the cathode of the diode.

14. An integrated circuit with electrostatic discharge (ESD) protection, the integrated circuit comprising:
a node operatively coupled to a pad and to an operational circuit of the integrated circuit, wherein the operational circuit is to be protected from ESD;
a diode having an anode and a cathode, wherein the anode is coupled to a first voltage reference terminal; and
two or more PMOS transistors arranged in series, the two or more PMOS transistors comprising at least a first PMOS transistor and a second PMOS transistor, the first PMOS transistor having a drain, a gate, and a source, the second PMOS transistor having a drain, a gate, and a source, wherein the drain of the first PMOS transistor is coupled to the node, wherein the source of the second PMOS transistor is coupled to the cathode of the diode, wherein the source of the first PMOS transistor is coupled, directly or indirectly, to the drain of the second PMOS transistor, and wherein gates of the PMOS transistors are coupled to voltage reference(s) so that at least one of the PMOS transistors is "off" when voltage at the node is less than voltage at the first voltage reference terminal.

15. The integrated circuit of claim 14, wherein the first voltage reference terminal is for ground.

16. The integrated circuit of claim 14, wherein the source of the first PMOS transistor is coupled directly to the drain of the second PMOS transistor.

17. The integrated circuit of claim 14, further comprising a third PMOS transistor, wherein the source of the first PMOS transistor is coupled indirectly to the drain of the second PMOS transistor via the third PMOS transistor in series between the first PMOS transistor and the second PMOS transistor, the third PMOS transistor having a gate, a drain, and a source, the drain of the third PMOS transistor coupled to the source of the first PMOS transistor, the source of the third PMOS transistor coupled to the drain of the second PMOS transistor.

18. The integrated circuit of claim 14, further comprising a gate network coupled to the node and to the first voltage reference terminal, wherein the gate network is configured to generate at least one output voltage between that of the node and the first voltage reference terminal as a reference voltage (s) for at least one of the PMOS transistors.

19. The integrated circuit of claim 18, wherein the gate of the first PMOS transistor is coupled to the gate network, and wherein the gate of the second PMOS transistor is coupled to the source of the second PMOS transistor.

20. The integrated circuit of claim 18, wherein the gate of the first PMOS transistor is coupled to the source of the first PMOS transistor, and wherein the gate of the second PMOS transistor is coupled to the gate network.

21. The integrated circuit of claim 18, wherein the gates of both the first PMOS transistor and the second PMOS transistor are coupled to respective outputs of the gate network.

22. The integrated circuit of claim 18, wherein the gate of the first PMOS transistor is coupled to the gate network, and wherein the gate of the second PMOS transistor is coupled to the first voltage reference.

23. The integrated circuit of claim 18, wherein the gate network comprises a voltage divider, and wherein the at least one output voltage is tapped from an inner terminal of the voltage divider.

24. The integrated circuit of claim 14, further comprising a diode group comprising one or more diodes, the diode group having an anode and a cathode, wherein the anode is coupled to the node, wherein the cathode is coupled to a second voltage reference terminal that is intended to be at a higher voltage potential than a voltage of the first voltage reference terminal.

25. The integrated circuit of claim 14, further comprising a diode group comprising a second diode and an NMOS transistor, the second diode having an anode and a cathode, the NMOS transistor having a gate, a drain, and a source, wherein the anode is coupled to the node, wherein the cathode is coupled to the drain of the NMOS transistor, and wherein the gate and the source are coupled to the first voltage reference terminal.

26. The integrated circuit of claim 25, wherein the NMOS transistor comprises a stack of NMOS transistors, wherein at least one of the NMOS transistors in the stack has a gate that is coupled to the output of the gate network.

27. An integrated circuit with electrostatic discharge (ESD) protection, the integrated circuit comprising:
- a node operatively coupled to a pad and to an operational circuit of the integrated circuit, wherein the operational circuit is to be protected from ESD;
- a diode having an anode and a cathode, wherein the cathode is coupled to the node; and
- a PMOS transistor having a gate, a drain, and a source, wherein the drain of the PMOS transistor is coupled to the anode of the diode, wherein the source of the PMOS transistor is coupled to a first voltage reference terminal, wherein the gate of the PMOS transistor is coupled to a reference voltage so that the PMOS transistor is "off" when voltage at the node is less than voltage at the first voltage reference terminal.

28. The integrated circuit of claim 27, wherein the gate of the PMOS transistor is coupled to the source of the PMOS transistor for the reference voltage.

29. The integrated circuit of claim 27, further comprising a gate network coupled to the node and to the first voltage reference terminal, wherein the gate network is configured to generate an output voltage between that of the node and the first voltage reference terminal, wherein the gate of the PMOS transistor is coupled to the output voltage of the gate network.

30. The integrated circuit of claim 27, further comprising a diode group comprising one or more diodes, the diode group having an anode and a cathode, wherein the anode is coupled to the node, wherein the cathode is coupled to a second voltage reference terminal that is intended to be at a higher voltage potential than a voltage of the first voltage reference terminal.

31. The integrated circuit of claim 27, further comprising a diode group comprising a second diode and an NMOS transistor, the second diode having an anode and a cathode, the NMOS transistor having a gate, a drain, and a source, wherein the anode is coupled to the node, wherein the cathode is coupled to the drain of the NMOS transistor, and wherein the gate and the source are coupled to the first voltage reference terminal.

32. The integrated circuit of claim 31, wherein the NMOS transistor comprises a stack of NMOS transistors, wherein at least one of the NMOS transistors in the stack has a gate that is coupled to the output of the gate network.

33. The integrated circuit of claim 27, wherein the integrated circuit further comprises a deep Nwell for isolation of the cathode of the diode.

34. The integrated circuit of claim 27, wherein the PMOS transistor comprises a stack of PMOS transistors, wherein at least one of the PMOS transistors in the stack has a gate that is coupled to the output of the gate network.

35. An integrated circuit with electrostatic discharge (ESD) protection, the integrated circuit comprising:
- a node operatively coupled to a pad and to an operational circuit of the integrated circuit, wherein the operational circuit is to be protected from ESD;
- a diode having an anode and a cathode, wherein the anode is coupled to a first voltage reference terminal; and
- a PMOS transistor having a gate, a drain, and a source, wherein the drain of the PMOS transistor is coupled to the node, wherein the source of the PMOS transistor is coupled to the cathode of the diode, wherein the gate of the PMOS transistor is coupled to a reference voltage so that the PMOS transistor is "off" when voltage at the node is less than voltage at the first voltage reference terminal.

36. The integrated circuit of claim 35, wherein the gate of the PMOS transistor is coupled to the source of the PMOS transistor for the reference voltage.

37. The integrated circuit of claim 35, further comprising a gate network coupled to the node and to the first voltage reference terminal, wherein the gate network is configured to generate an output voltage between that of the node and the first voltage reference terminal, wherein the gate of the PMOS transistor is coupled to the output voltage of the gate network.

38. The integrated circuit of claim 35, wherein the gate of the PMOS transistor is coupled to the first voltage reference terminal for the reference voltage.

39. The integrated circuit of claim 35, further comprising a diode group comprising one or more diodes, the diode group having an anode and a cathode, wherein the anode is coupled to the node, wherein the cathode is coupled to a second voltage reference terminal that is intended to be at a higher voltage potential than a voltage of the first voltage reference terminal.

40. The integrated circuit of claim 35, further comprising a diode group comprising a second diode and an NMOS transistor, the second diode having an anode and a cathode, the NMOS transistor having a gate, a drain, and a source, wherein the anode is coupled to the node, wherein the cathode is coupled to the drain of the NMOS transistor, and wherein the gate and the source are coupled to the first voltage reference terminal.

41. The integrated circuit of claim 35, wherein the PMOS transistor comprises a stack of PMOS transistors, wherein at least one of the PMOS transistors in the stack has a gate that is coupled to the output of the gate network.

42. The integrated circuit of claim 41, further comprising a diode group comprising one or more diodes, the diode group having an anode and a cathode, wherein the anode is coupled to the node, wherein the cathode is coupled to a second voltage reference terminal that is intended to be at a higher voltage potential than a voltage of the first voltage reference terminal.

43. The integrated circuit of claim 41, further comprising a diode group comprising a second diode and an NMOS transistor, the second diode having an anode and a cathode, the NMOS transistor having a gate, a drain, and a source, wherein the anode is coupled to the node, wherein the cathode is coupled to the drain of the NMOS transistor, and wherein the gate and the source are coupled to the first voltage reference terminal.

44. The integrated circuit of claim 43, wherein the NMOS transistor comprises a stack of NMOS transistors, wherein at least one of the NMOS transistors in the stack has a gate that is coupled to the output of the gate network.

45. An integrated circuit with electrostatic discharge (ESD) protection, the integrated circuit comprising:
- a node operatively coupled to a pad and to an operational circuit of the integrated circuit, wherein the operational circuit is to be protected from ESD;
- a diode having an anode and a cathode, wherein the cathode is coupled to the node; and
- two or more NMOS transistors arranged in series, the two or more NMOS transistors comprising at least a first NMOS transistor and a second NMOS transistor, the first NMOS transistor having a drain, a gate, and a source, the second NMOS transistor having a drain, a gate, and a source, wherein the source of the first NMOS transistor is coupled to the anode of the diode, wherein the drain of the second NMOS transistor is coupled to a first voltage reference terminal, wherein the drain of the first NMOS transistor is coupled, directly or indirectly, to the source of the second NMOS transistor, and wherein gates of the NMOS transistors are coupled to voltage reference(s) so that at least one of the NMOS transistors is "off" when voltage at the node is less than voltage at the first voltage reference terminal.

46. The integrated circuit of claim 45, wherein the first voltage reference terminal is for ground.

47. The integrated circuit of claim 45, wherein the drain of the first NMOS transistor is coupled directly to the source of the second NMOS transistor.

48. The integrated circuit of claim 45, further comprising a third NMOS transistor, wherein the drain of the first NMOS transistor is coupled indirectly to the source of the second NMOS transistor via the third NMOS transistor in series between the first NMOS transistor and the second NMOS transistor, the third NMOS transistor having a gate, a drain, and a source, the source of the third NMOS transistor coupled to the drain of the first NMOS transistor, the drain of the third NMOS transistor coupled to the source of the second NMOS transistor.

49. The integrated circuit of claim 45, further comprising a gate network coupled to the node and to the first voltage reference terminal, wherein the gate network is configured to generate at least one output voltage between that of the node and the first voltage reference terminal as a reference voltage (s) for at least one of the NMOS transistors.

50. The integrated circuit of claim 49, wherein the gate of the first NMOS transistor is coupled to the gate network, and wherein the gate of the second NMOS transistor is coupled to the source of the second NMOS transistor.

51. The integrated circuit of claim 49, wherein the gate of the first NMOS transistor is coupled to the source of the first NMOS transistor, and wherein the gate of the second NMOS transistor is coupled to the gate network.

52. The integrated circuit of claim 49, wherein the gate of the first NMOS transistor is coupled to the gate network, and wherein the gate of the second NMOS transistor is coupled to the gate network.

53. The integrated circuit of claim 49, wherein the gate network comprises a voltage divider, and wherein the at least one output voltage is tapped from an inner terminal of the voltage divider.

54. The integrated circuit of claim 45, further comprising a diode group comprising one or more diodes, the diode group having an anode and a cathode, wherein the anode is coupled to the node, wherein the cathode is coupled to a second voltage reference terminal that is intended to be at a higher voltage potential than a voltage of the first voltage reference terminal.

55. The integrated circuit of claim 45, further comprising a diode group comprising a second diode and a third NMOS transistor, the second diode having an anode and a cathode, the third NMOS transistor having a gate, a drain, and a source, wherein the anode is coupled to the node, wherein the cathode is coupled to the drain of the third NMOS transistor, and wherein the gate and the source are coupled to the first voltage reference terminal.

56. The integrated circuit of claim 55, wherein the NMOS transistor comprises a stack of NMOS transistors, wherein at least one of the NMOS transistors in the stack has a gate that is coupled to the output of the gate network.

57. The integrated circuit of claim 45, wherein the integrated circuit further comprises a deep Nwell for isolation of the cathode of the diode and for the two or more NMOS transistors.

58. An integrated circuit with electrostatic discharge (ESD) protection, the integrated circuit comprising:
a node operatively coupled to a pad and to an operational circuit of the integrated circuit, wherein the operational circuit is to be protected from ESD;
a diode having an anode and a cathode, wherein the cathode is coupled to the node; and
an NMOS transistor having a gate, a drain, and a source, wherein the source of the NMOS transistor is coupled to the anode of the diode, wherein the drain of the NMOS transistor is coupled to a first voltage reference terminal, wherein the first voltage reference terminal is for ground, wherein the gate of the NMOS transistor is coupled to a reference voltage so that the NMOS transistor is "off" when voltage at the node is less than voltage at the first voltage reference terminal.

59. An integrated circuit with electrostatic discharge (ESD) protection, the integrated circuit comprising:
a node operatively coupled to a pad and to an operational circuit of the integrated circuit, wherein the operational circuit is to be protected from ESD;
a diode having an anode and a cathode, wherein the cathode is coupled to the node; and
an NMOS transistor having a gate, a drain, and a source, wherein the source of the NMOS transistor is coupled to the anode of the diode, wherein the drain of the NMOS transistor is coupled to a first voltage reference terminal, wherein the gate of the NMOS transistor is coupled to a reference voltage so that the NMOS transistor is "off" when voltage at the node is less than voltage at the first voltage reference terminal;
wherein the gate of the NMOS transistor is coupled to the source of the NMOS transistor for the reference voltage.

60. An integrated circuit with electrostatic discharge (ESD) protection, the integrated circuit comprising:
a node operatively coupled to a pad and to an operational circuit of the integrated circuit, wherein the operational circuit is to be protected from ESD;
a diode having an anode and a cathode, wherein the cathode is coupled to the node;
an NMOS transistor having a gate, a drain, and a source, wherein the source of the NMOS transistor is coupled to the anode of the diode, wherein the drain of the NMOS transistor is coupled to a first voltage reference terminal, wherein the gate of the NMOS transistor is coupled to a reference voltage so that the NMOS transistor is "off" when voltage at the node is less than voltage at the first voltage reference terminal; and
a gate network coupled to the node and to the first voltage reference terminal, wherein the gate network is configured to generate an output voltage between that of the node and the first voltage reference terminal, wherein the gate of the NMOS transistor is coupled to the output voltage of the gate network.

61. An integrated circuit with electrostatic discharge (ESD) protection, the integrated circuit comprising:
a node operatively coupled to a pad and to an operational circuit of the integrated circuit, wherein the operational circuit is to be protected from ESD;
a diode having an anode and a cathode, wherein the cathode is coupled to the node; and
an NMOS transistor having a gate, a drain, and a source, wherein the source of the NMOS transistor is coupled to the anode of the diode, wherein the drain of the NMOS transistor is coupled to a first voltage reference terminal, wherein the gate of the NMOS transistor is coupled to a reference voltage so that the NMOS transistor is "off" when voltage at the node is less than voltage at the first voltage reference terminal;

wherein the NMOS transistor comprises a stack of NMOS transistors, wherein at least one of the NMOS transistors in the stack has a gate that is coupled to the output of the gate network.

62. The integrated circuit of claim 58, further comprising a diode group comprising one or more diodes, the diode group having an anode and a cathode, wherein the anode is coupled to the node, wherein the cathode is coupled to a second voltage reference terminal that is intended to be at a higher voltage potential than a voltage of the first voltage reference terminal.

63. An integrated circuit with electrostatic discharge (ESD) protection, the integrated circuit comprising:
   a node operatively coupled to a pad and to an operational circuit of the integrated circuit, wherein the operational circuit is to be protected from ESD;
   a diode having an anode and a cathode, wherein the cathode is coupled to the node;
   an NMOS transistor having a gate, a drain, and a source, wherein the source of the NMOS transistor is coupled to the anode of the diode, wherein the drain of the NMOS transistor is coupled to a first voltage reference terminal, wherein the gate of the NMOS transistor is coupled to a reference voltage so that the NMOS transistor is "off" when voltage at the node is less than voltage at the first voltage reference terminal; and
   a diode group comprising a second diode and a second NMOS transistor, the second diode having an anode and a cathode, the second NMOS transistor having a gate, a drain, and a source, wherein the anode is coupled to the node, wherein the cathode is coupled to the drain of the second NMOS transistor, and wherein the gate and the source are coupled to the first voltage reference terminal.

64. An integrated circuit with electrostatic discharge (ESD) protection, the integrated circuit comprising:
   a node operatively coupled to a pad and to an operational circuit of the integrated circuit, wherein the operational circuit is to be protected from ESD;
   a diode having an anode and a cathode, wherein the cathode is coupled to the node; and
   an NMOS transistor having a gate, a drain, and a source, wherein the source of the NMOS transistor is coupled to the anode of the diode, wherein the drain of the NMOS transistor is coupled to a first voltage reference terminal, wherein the gate of the NMOS transistor is coupled to a reference voltage so that the NMOS transistor is "off" when voltage at the node is less than voltage at the first voltage reference terminal;
   wherein the integrated circuit further comprises a deep Nwell for isolation of the cathode of the diode and for the two or more NMOS transistor.

65. The integrated circuit of claim 1, wherein current for an ESD event is conducted through a bulk of a parasitic PNP bipolar transistor.

66. The integrated circuit of claim 14, wherein current for an ESD event is conducted through a bulk of a parasitic PNP bipolar transistor.

67. The integrated circuit of claim 27, wherein current for an ESD event is conducted through a bulk of a parasitic PNP bipolar transistor.

68. The integrated circuit of claim 35, wherein current for an ESD event is conducted through a bulk of a parasitic PNP bipolar transistor.

69. The integrated circuit of claim 45, wherein current for an ESD event is conducted through a bulk of a parasitic NPN bipolar transistor.

70. The integrated circuit of claim 58, wherein current for an ESD event is conducted through a bulk of a parasitic NPN bipolar transistor.

\* \* \* \* \*